(12) United States Patent
Cherman et al.

(10) Patent No.: US 12,342,503 B2
(45) Date of Patent: Jun. 24, 2025

(54) DEVICE AND SYSTEM FOR COOLING AN ELECTRONIC COMPONENT

(71) Applicant: IMEC VZW, Leuven (BE)

(72) Inventors: Vladimir Cherman, Heverlee (BE); Herman Oprins, Herent (BE); Eric Beyne, Heverlee (BE)

(73) Assignee: IMEC vzw, Leuven (BE)

( * ) Notice: Subject to any disclaimer, the term of this patent is extended or adjusted under 35 U.S.C. 154(b) by 157 days.

(21) Appl. No.: 18/480,029

(22) Filed: Oct. 3, 2023

(65) Prior Publication Data

US 2024/0121914 A1 Apr. 11, 2024

(30) Foreign Application Priority Data

Oct. 5, 2022 (EP) ..................................... 22199883

(51) Int. Cl.
H05K 7/20 (2006.01)

(52) U.S. Cl.
CPC ..... H05K 7/20327 (2013.01); H05K 7/20318 (2013.01)

(58) Field of Classification Search
CPC ............. H01L 23/4336; H01L 23/4735; H01L 23/427; H05K 7/20327; H05K 7/20318
See application file for complete search history.

(56) References Cited

U.S. PATENT DOCUMENTS

| | | | | |
|---|---|---|---|---|
| 5,412,536 A | * | 5/1995 | Anderson | H01L 23/427 174/15.2 |
| 5,522,452 A | * | 6/1996 | Mizuno | H01L 23/4336 165/286 |
| 6,105,373 A | * | 8/2000 | Watanabe | F25B 21/02 62/3.7 |

(Continued)

FOREIGN PATENT DOCUMENTS

| | | |
|---|---|---|
| CN | 109637987 A | 4/2019 |
| EP | 3188230 A1 | 7/2017 |
| JP | 2002-151638 A | 5/2002 |

OTHER PUBLICATIONS

Extended European Search Report in European Patent Application No. 22199883.4, dated Mar. 16, 2023 in 10 pages.

(Continued)

*Primary Examiner* — Lionel Nouketcha
(74) *Attorney, Agent, or Firm* — Knobbe, Martens, Olson & Bear LLP

(57) ABSTRACT

A cooling device configured to be mounted in close proximity to an electronic component that is to be cooled is provided. In one aspect, the device includes impingement channels and return channels for guiding a flow of cooling fluid towards and away from a cooled surface of the electronic component. The device also includes a heat exchanger and a pump, so that the flow cycle of a cooling fluid is fully confined within the device itself. The impingement channels, the return channels, and the heat exchanger are inte- (Continued)

grated in a common housing, which includes an inlet opening and an outlet opening for coupling the device to a refrigerant loop. The pump may be a micropump mounted directly on the housing and coupled to the inlet and outlet openings in the housing. A cooling system including the device and the refrigerant loop is also provided.

11 Claims, 4 Drawing Sheets

(56) References Cited

U.S. PATENT DOCUMENTS

| | | | | |
|---|---|---|---|---|
| 7,948,757 | B2* | 5/2011 | Campbell | H01L 23/427 |
| | | | | 174/15.1 |
| 2007/0274045 | A1 | 11/2007 | Campbell et al. | |
| 2008/0303137 | A1 | 12/2008 | Ward et al. | |
| 2010/0328888 | A1* | 12/2010 | Campbell | H01L 23/4735 |
| | | | | 361/699 |
| 2010/0328889 | A1 | 12/2010 | Campbell et al. | |
| 2017/0146273 | A1* | 5/2017 | Spitzner | H05K 7/20336 |
| 2017/0196120 | A1 | 7/2017 | Oprins et al. | |
| 2020/0105645 | A1* | 4/2020 | Mydlarski | H01L 23/4735 |

OTHER PUBLICATIONS

Wei et al., "High-Efficiency Polymer-Based Direct Multi-Jet Impingement Cooling Solution for High-Power Devices" IEEE Transactions on Power Electronics, vol. 34, No. 7, Jul. 2019, pp. 6601-6612.

* cited by examiner

DEVICE AND SYSTEM FOR COOLING AN ELECTRONIC COMPONENT

CROSS-REFERENCE TO RELATED APPLICATIONS

This application claims foreign priority to European Patent Application No. EP 22199883.4, filed Oct. 5, 2022, the content of which is incorporated by reference herein in its entirety.

BACKGROUND

Technical Field

The disclosed technology is related to the cooling of semiconductor chips by impingement cooling.

Description of the Related Technology

High-performance integrated circuits require an increasing degree of cooling power in order to control the temperature of chips which include many high-power devices on a small chip area. Liquid cooling has replaced air cooling in a number of configurations. In particular, impingement of a cooled liquid directly on the surface of a packaged chip or a packaged stack of chips has been proven to provide efficient cooling power, and various solutions of this type have been proposed.

EP Patent Publication No. EP3188230A1 discloses an impingement head provided with an array of nozzles, each nozzle being configured to direct a stream of cooling liquid vertically onto a horizontally placed surface of a chip package. The impingement head is mounted directly on the chip package, and includes an inlet port and an outlet port configured to be coupled to a cooling liquid loop. The loop further includes a pump and a heat exchanger, configured to cool the cooling liquid heated by contact with the chip package.

The system of EP Patent Publication No. EP3188230A1 requires tubing between the pump and the impingement head, and connectors for coupling the tubes to the impingement head. The length of the tubes can cause an important heat loss as well as a pressure drop that can negatively influence the performance of the pump. In addition, reservoirs are included for both the cooling liquid loop and the loop for the refrigerant used in the heat exchanger, which may make the system as a whole rather complex. The use of connectors and tubes formed of different materials may also increase the difficulty in terms of choosing the optimal cooling liquid, as many liquids are chemically incompatible with the materials of these various components.

It is therefore desirable to have a cooling system that is technically more straightforward and wherein the heat and pressure losses are reduced.

SUMMARY OF CERTAIN INVENTIVE ASPECTS

The disclosed technology aims to provide a solution to the problems highlighted above. These and other aims can be achieved by a cooling device and system in accordance with embodiments of the disclosed technology.

Like the impingement head of the prior device described above, a cooling device according to the disclosed technology is configured to be mounted in close proximity to an electronic component that is to be cooled. Also like the prior device, the cooling device according to the disclosed technology can include impingement channels and return channels for guiding a flow of cooling fluid towards and away from a surface of the electronic component that is to be cooled, but contrary to the prior art configurations, the cooling device further includes a heat exchanger and a pump, so that the flow cycle of a cooling fluid is fully confined within the cooling device itself. The impingement channels, the return channels, and the heat exchanger are integrated in a common housing, that includes an inlet opening and an outlet opening for coupling the cooling device to a refrigerant loop. The pump may be a micropump mounted directly on the common housing and coupled to inlet and outlet openings in the common housing.

In the context of the disclosed technology, the term "cooling fluid" is to be understood as a fluid that may be in the liquid state throughout the flow cycle, or in the liquid state during part of the flow cycle while in the gaseous state during another part of the flow cycle, or in the form of a mixture of the two during part of the flow cycle. In the latter case, cooling of the electronic component involves the at least partial evaporation of the cooling fluid from the liquid state to the gaseous state. The heat exchanger then works as a condenser wherein the cooling fluid changes again from the gaseous state to the liquid state.

Embodiments of the disclosed technology present a number of advantages over the prior art and solutions to the problems highlighted above. Due to the absence of long tubing and connectors between the various elements of the cooling fluid loop, the amount of cooling fluid is much smaller than that of the prior art solutions, and no cooling liquid reservoir is needed. Heat and pressure losses in the cooling fluid cycle are thereby much reduced and the compatibility of the cooling fluid with materials used in the cycle are less of a concern. The disclosed technology is related to the cooling device as such and to a cooling system including the cooling device according to the disclosed technology.

The disclosed technology is related in particular to a device for cooling an electronic component, including:
- a plurality of first channels configured to work as impingement channels, enabling a cooling fluid in the liquid state to impinge on the surface of the electronic component, when the device is mounted in close proximity to the surface;
- a plurality of second channels configured to work as return channels, enabling to conduct the cooling fluid away from the surface after exchanging heat with the surface;
- a pump configured to cyclically drive the flow of the cooling fluid in a flow cycle that is confined within the device, the flow cycle including the flow of the cooling fluid through the first channels and subsequently through the second channels;
- a heat exchanger including:
  - one or more heat exchange channels configured so that the flow cycle further includes the flow of the cooling fluid through the one or more heat exchange channels before or after exchanging heat with the surface of the electronic component, and
  - one or more refrigerant channels configured to allow the passage of a refrigerant so as to enable a heat exchange between the refrigerant and the cooling fluid; and
- a housing, wherein the first channels, the second channels, and the heat exchanger are integrated in the housing, the housing including a refrigerant inlet and a refrigerant outlet configured to enable the refrigerant to consecutively flow into the device, through the one or more refrigerant channels, and out of the device.

According to an embodiment, the housing further includes an inlet opening and an outlet opening for the cooling fluid, wherein the pump is mounted on the housing and coupled to the inlet and outlet openings.

According to an embodiment, the housing is an integral piece formed of a single material. According to another embodiment, the housing is an assembly of a first housing including the plurality of first channels and the plurality of second channels, and a second housing including the heat exchanger.

The pump may be a micropump.

According to an embodiment, the impingement channels are arranged in a square or rectangular array of impingement channels, each impingement channel being at least partly surrounded by a return channel.

According to an embodiment, the device is configured for circulating the cooling fluid in the liquid state of the fluid.

According to an embodiment, the housing is shaped as a rectangular block with the one or more heat exchange channels of the heat exchanger running vertically when the housing is mounted on a horizontal surface, and wherein the refrigerant inlet and the refrigerant outlet are located in opposite sidewalls of the housing, with the one or more refrigerant channels running transversally relative to the one or more heat exchange channels.

According to an embodiment, the device further includes an expansion reservoir so that the device enables:
  cooling the electronic component through the at least partial evaporation of the cooling fluid when the fluid impinges on the electronic component in the liquid state,
  expansion of the cooling fluid in the gaseous state, in the expansion reservoir, and
  condensation of the cooling fluid from the gaseous state to the liquid state in the heat exchanger, the heat exchanger thereby acting as a condenser.

According to an embodiment, the expansion reservoir is in fluid communication with an internal channel formed in the housing, configured to conduct the vapor formed by the evaporation from the return channels to the heat exchanger.

According to an embodiment, the heat exchanger is configured to work as a condenser, and the heat exchanger is placed at a higher level than the pump, when the device is placed on a horizontal surface.

The disclosed technology is equally related to a cooling system for cooling an electronic component, the system including a device according to the disclosed technology, and a refrigerant loop for circulating a refrigerant therein, wherein the refrigerant loop includes the passage from the refrigerant inlet of the device to the refrigerant outlet of the device.

DETAILED DESCRIPTION OF CERTAIN ILLUSTRATIVE EMBODIMENTS

Figure 1A:
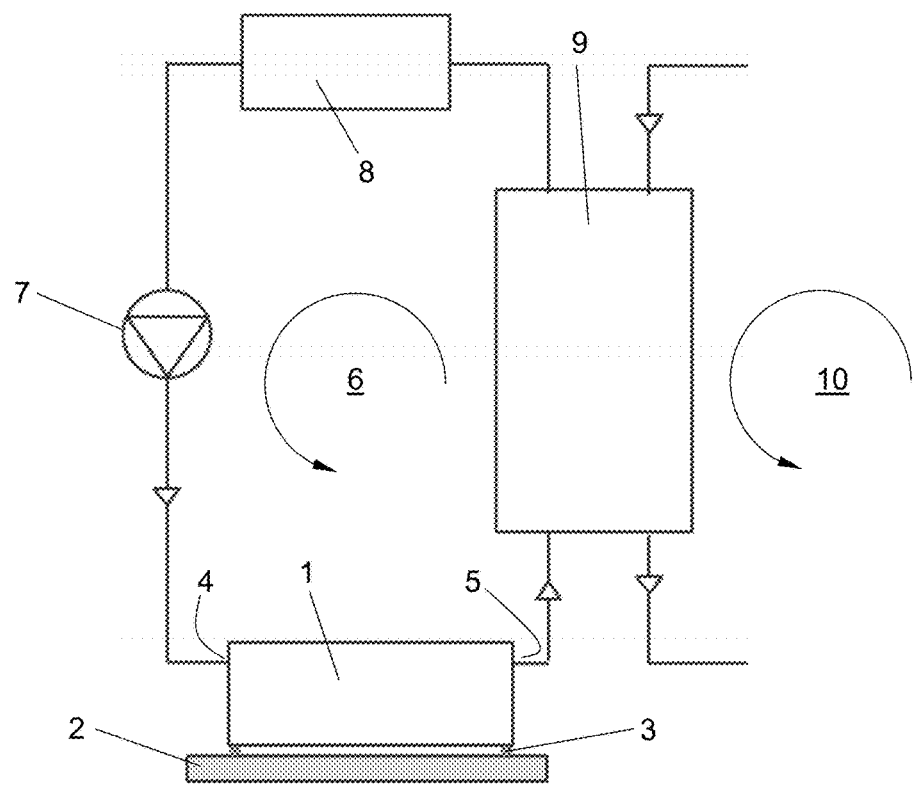
FIGS. 1A and 1B illustrate a liquid impingement cooling solution for cooling a chip package.

FIG. 1A illustrates the basic components of a cooling system as disclosed in EP Patent Publication No. EP3188230A1. The impingement head 1 is mounted on an electronic component 2, for example a chip package 2, with a seal 3 arranged along the circumference of the impingement head 1. The impingement head 1 includes an inlet 4 and an outlet 5 for the cooling liquid that circulates in a primary circulation loop 6. The cooling liquid is circulated in the primary loop circulation 6 by a pump 7 that displaces the cooling liquid from a reservoir 8 to the impingement head 1. After interacting with the chip package 2, the cooling liquid flows through a heat exchanger 9. In the heat exchanger 9, the cooling liquid is cooled by exchanging heat with a refrigerant that is circulating in a secondary loop 10. The secondary loop 10 is only partly shown in the drawing. After passing through the heat exchanger 9, the cooling liquid flows back to the reservoir 8. In the embodiment shown in FIG. 1A, the cooling liquid is in the liquid state throughout the primary flow cycle 6.

Figure 1B:
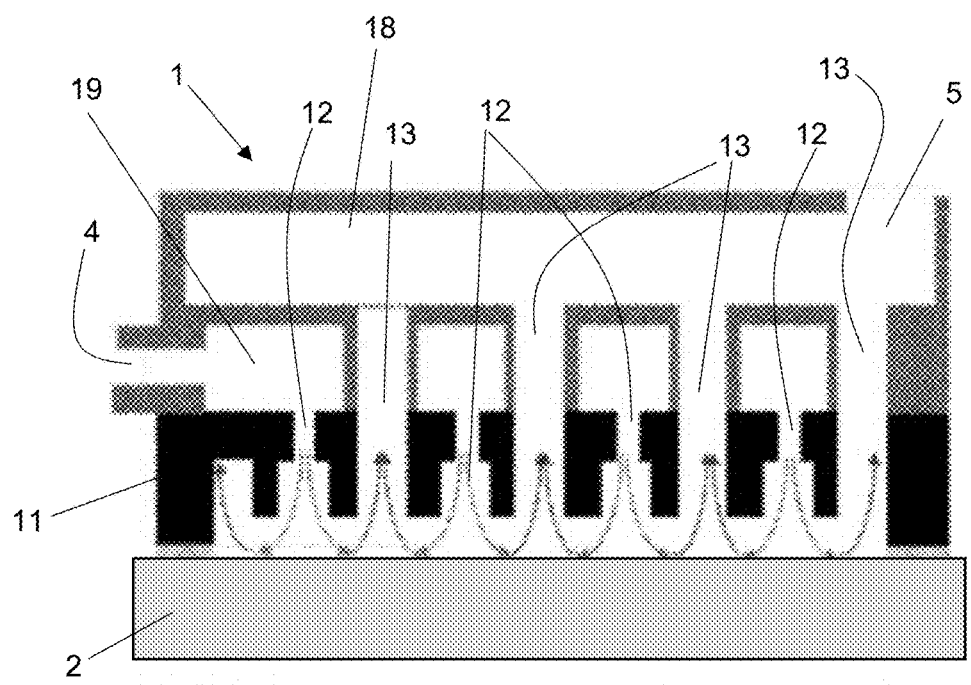

FIG. 1B shows a schematic cross-section of an impingement head 1 according to prior systems. It is seen to include a housing 11 with the inlet 4 and the outlet 5 realized as openings in the housing 11. First channels 12 are in fluid communication with the inlet 4 via an inlet collector 19 and are configured to work as impingement channels, that is, channels configured to direct a flow of the cooling liquid impinging on the chip package 2. Second channels 13 are arranged around the first channels 12 and are configured to direct the cooling liquid away from the chip package 2 after its interaction therewith. The second channels 13 are in fluid communication with the outlet 5 via an outlet collector 18. In the context of the disclosed technology, the term "in fluid communication" is to be understood as "connected through conduits suitable for the displacement of a fluid in liquid or gaseous form." The impingement head 1 includes a square or rectangular array of regularly spaced first channels 12, surrounded by respective second channels 13. The inlet 4 and the outlet 5 are coupled to external tubes (not shown) which are part of the primary circulation loop 6.

Figure 2:
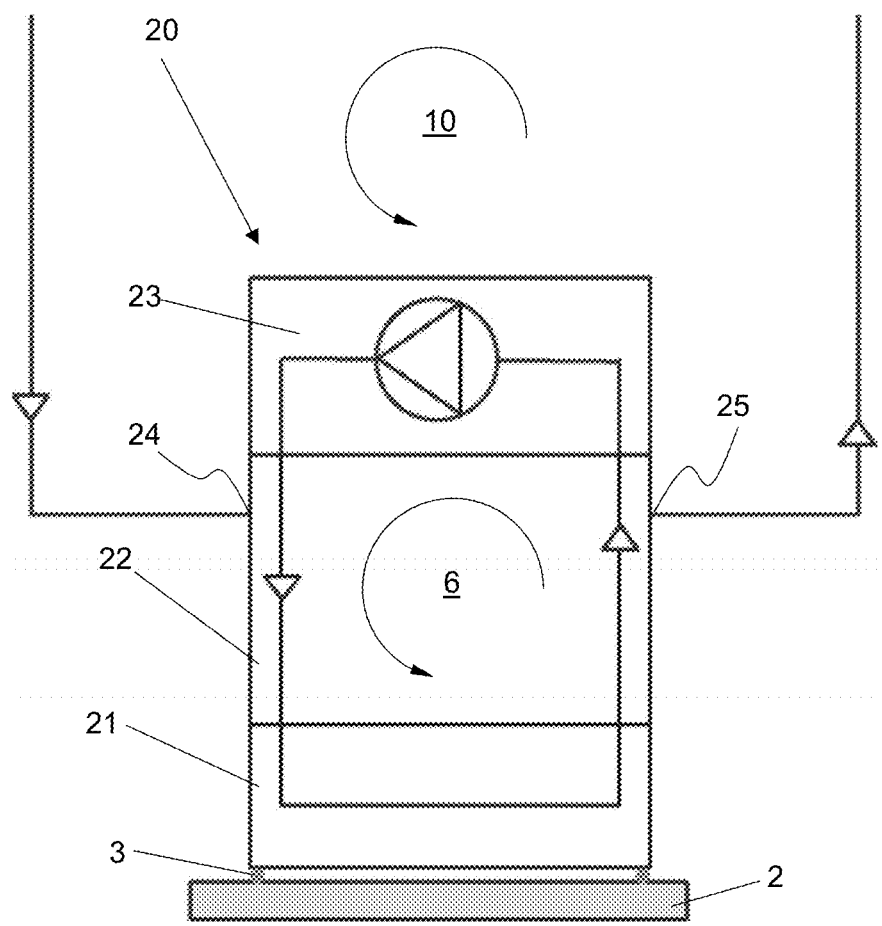
FIG. 2 schematically illustrates the main components of a device in accordance with an embodiment of the disclosed technology, configured to circulate a cooling fluid in the liquid state.

FIG. 2 illustrates a cooling system that utilizes a cooling device 20 according to a first embodiment of the disclosed technology, configured to cool a chip package by a cooling fluid that is in the liquid state. An impingement head 21, a heat exchanger 22, and a pump 23 are integrated in the cooling device 20. The cooling device 20 is mounted on the chip package 2 that is to be cooled. The impingement head 21 may have features in common with the impingement head 1 described with reference to FIGS. 1A and 1B, that is, including an array of first impingement channels surrounded by second channels, but any other design is possible within the scope of the disclosed technology. In embodiments of the disclosed technology, the heat exchanger 22 and the pump 23 are now integrated with the impingement head 21 into a single device. This means that the primary loop 6 in which the cooling liquid is circulating is fully integrated in the cooling device itself. This also means that the cooling device 20 includes a fixed amount of cooling liquid that is constantly being circulated inside the cooling device when the cooling device is in operation. The cooling device 20 includes an inlet 24 and an outlet 25 for a refrigerant that is being circulated in a secondary loop 10. The secondary loop is only partly shown in the drawing, and may have features in common with the cooling systems described with reference to FIGS. 1A and 1B. In the heat exchanger 22, the refrigerant cools the cooling liquid circulating in the primary loop 6.

As the primary loop 6 is fully confined in the cooling device 20, no tubing is required for the cooling liquid outside the impingement head 21. Major heat and pressure losses as a consequence of such tubing are therefore no longer a problem. The cooling system as a whole is simplified, as no external reservoir for the cooling liquid is needed. The required amount of cooling liquid is much smaller compared to prior systems. As the cooling liquid is not in contact with external tubing but only with channels inside the device, incompatibility of the cooling liquid with connectors and tubing materials is no longer an issue, so that the number of suitable cooling liquids is increased compared to prior systems.

Figure 3:
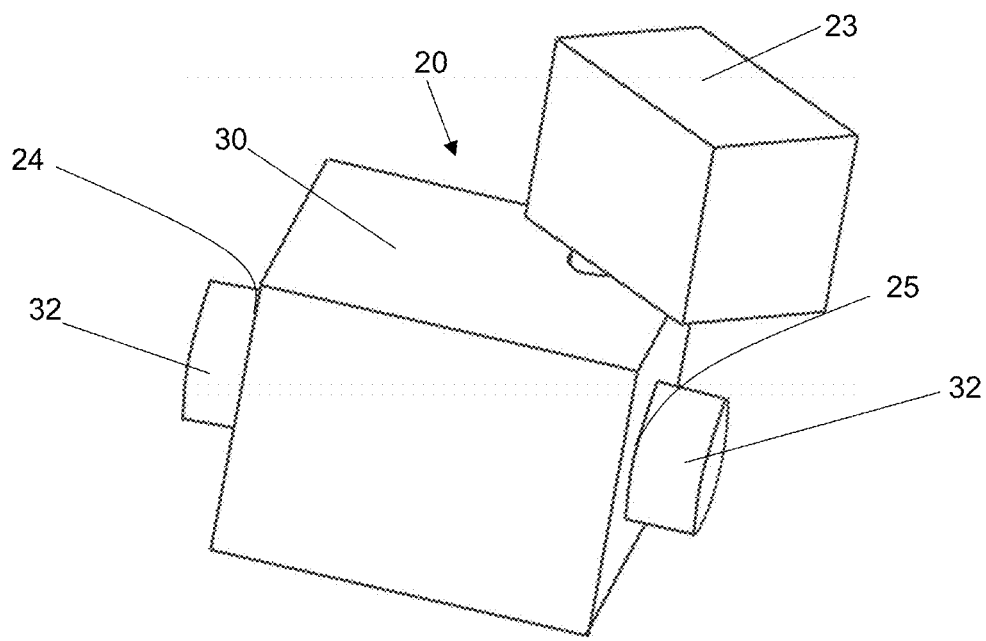
FIGS. 3 and 4 illustrate the external appearance of a device according to an embodiment of the disclosed technology.
Figure 4:
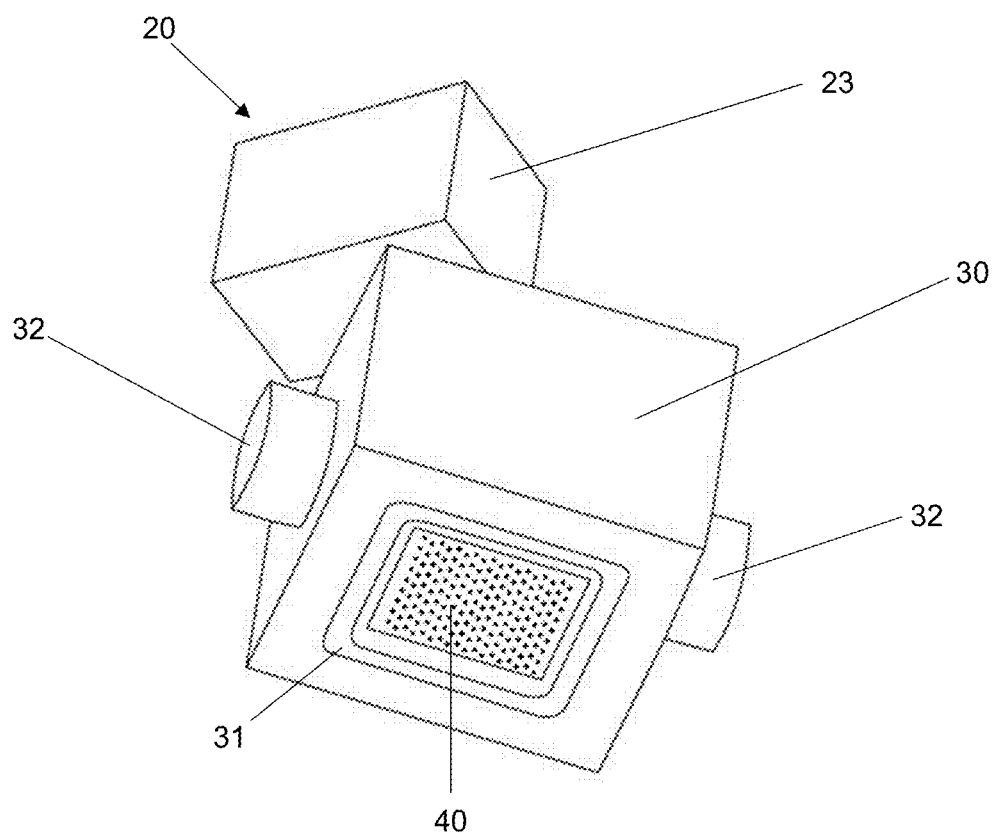

FIGS. 3 and 4 show images of an example cooling device 20 in accordance with the first embodiment. It will be understood that this particular design does not limit the scope of the disclosed technology, but it is merely shown as one way of bringing the first embodiment into practice. As seen in FIG. 3, the cooling device 20 includes a block-shaped housing 30 with the pump 23 attached to the top of the housing. The impingement head and the heat exchanger are co-integrated in the common housing 30. FIG. 4 shows the array of impingement channels 40 issuing from the bottom of the housing 30. A groove 31 is arranged around the array of impingement channels, for accommodating a seal when the cooling device 20 is mounted on a chip package. Connectors 32 are coupled to the refrigerant inlet opening 24 and the refrigerant outlet opening 25 provided in opposite sidewalls of the housing 30, for connection to tubing for the flow of the refrigerant flowing in the external loop 10.

The dimensions of the housing 30 can be adapted to dimensions of a chip package that is to be cooled. The dimensions of the housing 30 may, for example, be in the order of a few centimeters in all three dimensions. The pump 23 can be a micropump, including any type of micropump suitable for the functionality described above.

The housing 30 may, for example, be an integral piece produced by a 3D printing technique. Suitable materials for the housing produced in this way include, but are not limited to, copper alloys and aluminium alloys. Alternatively, the impingement head 21 and the heat exchanger 22 could be produced separately and assembled together by any suitable assembly method.

Figure 5:
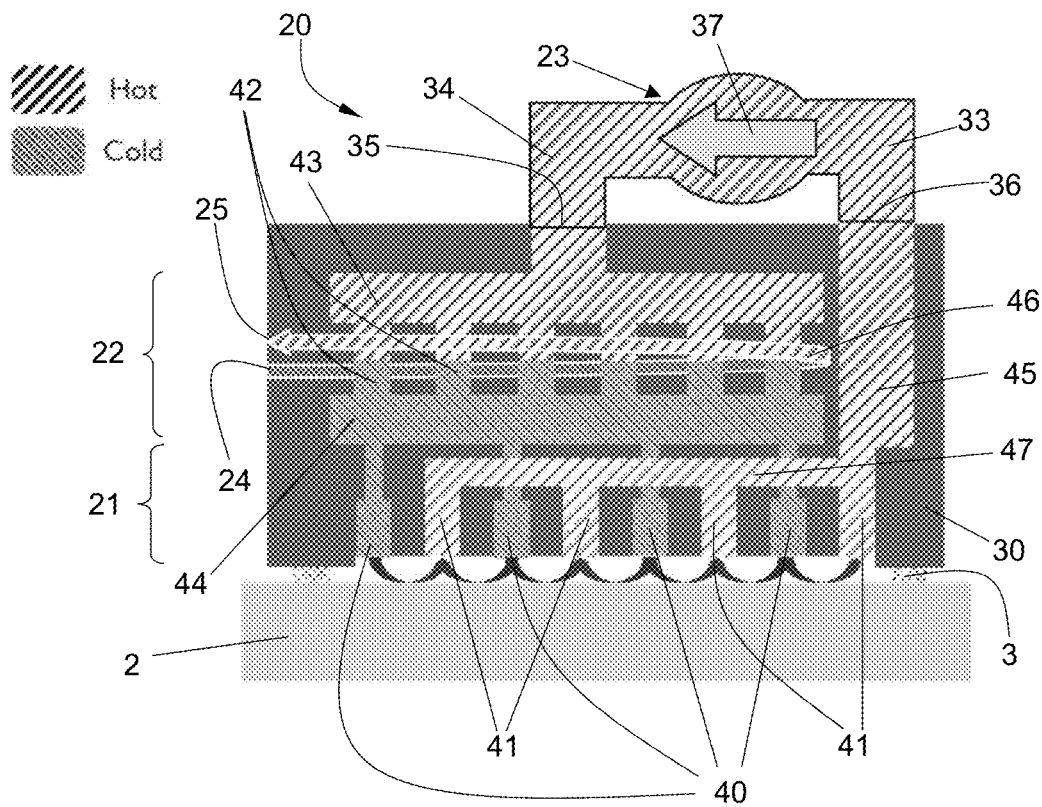
FIG. 5 is a schematic section view of the internal channels in a device according to an embodiment of the disclosed technology, configured to circulate a cooling fluid in the liquid state.

FIG. 5 is a schematic section view of the various channels inside the housing 30 in an embodiment suitable for circulating a cooling fluid in the liquid state. The figure is not a technical drawing but rather a conceptual representation of the inner structure of the cooling device 20. The temperature (hot or cold) of the liquids flowing through the cooling device are indicated by the type of hatching, as explained in the legend included in the drawing. The inlet channel 33 and the outlet channel 34 of the pump 23 are coupled respectively to an outlet opening 36 and an inlet opening 35 of the housing 30. The direction in which the cooling liquid is circulating is indicated by the arrow 37.

The impingement head 21 and the heat exchanger 22 are integrated in the housing 30. The impingement head 21 includes impingement channels 40 and return channels 41, the return channels 41 fully or partially surrounding the impingement channels 40. The heat exchanger 22 includes vertically arranged channels 42 extending between an upper collector 43 and a lower collector 44, the upper collector 43 being in fluid communication with the inlet opening 35 of the housing and the lower collector 44 being in fluid communication with the impingement channels 40 of the impingement head 21. The return channels 41 are in fluid communication with the outlet opening 36 of the housing through an outlet collector 47 and an internal channel 45.

As stated above with reference to FIG. 2, the cooling liquid exchanges heat with a refrigerant flowing through a secondary loop 10 coupled to the cooling device 20 via the inlet and outlet openings 24 and 25. These inlet and outlet openings are indicated also in FIG. 5, although in a schematic manner. Between these openings, the housing 30 includes a transverse refrigerant channel symbolized in FIG. 5 by the curved line 46. As seen in FIGS. 3 and 4, the refrigerant channel may extend from one sidewall of the housing to the opposite sidewall, with connectors 32 attached to the openings 24 and 25 provided in the opposite sidewalls. The refrigerant thereby flows transversally across the channels 42 of the heat exchanger 22. Other configurations are possible, however. For example, the refrigerant could flow through channels arranged parallel to the channels 42, or the channels 42 for the cooling liquid could be oriented differently from the vertical orientation shown in the drawing.

In the configuration illustrated in FIG. 5, the heat exchanger 22 is coupled between the cooling liquid's inlet opening 35 of the housing 30 and the impingement channels 40. According to another embodiment that is configured to circulate a cooling fluid in the liquid state, the heat exchanger may be coupled between the return channels 41 and the cooling liquid's outlet opening 36 of the housing 30.

According to still another embodiment configured to circulate a cooling fluid in the liquid state, the cooling device could include two heat exchangers, one coupled downstream of the inlet opening 35 and one coupled upstream of the outlet opening 36. In this embodiment, the cooling device is configured to be coupled to two separate external loops. This enables cooling the cooling liquid in two stages, which makes it possible to better control the temperature of the cooling liquid as it impinges on the surface of the chip package.

In the above embodiments, the cooling device 20 is configured to cool an electronic component by circulating a cooling fluid in the liquid state. The disclosed technology is not limited to such embodiments, however, and also includes a cooling device adapted to circulate a cooling fluid that changes from the liquid state to the gaseous state and vice versa in the course of each circulation of the fluid in the primary cycle 6.

Figure 6:
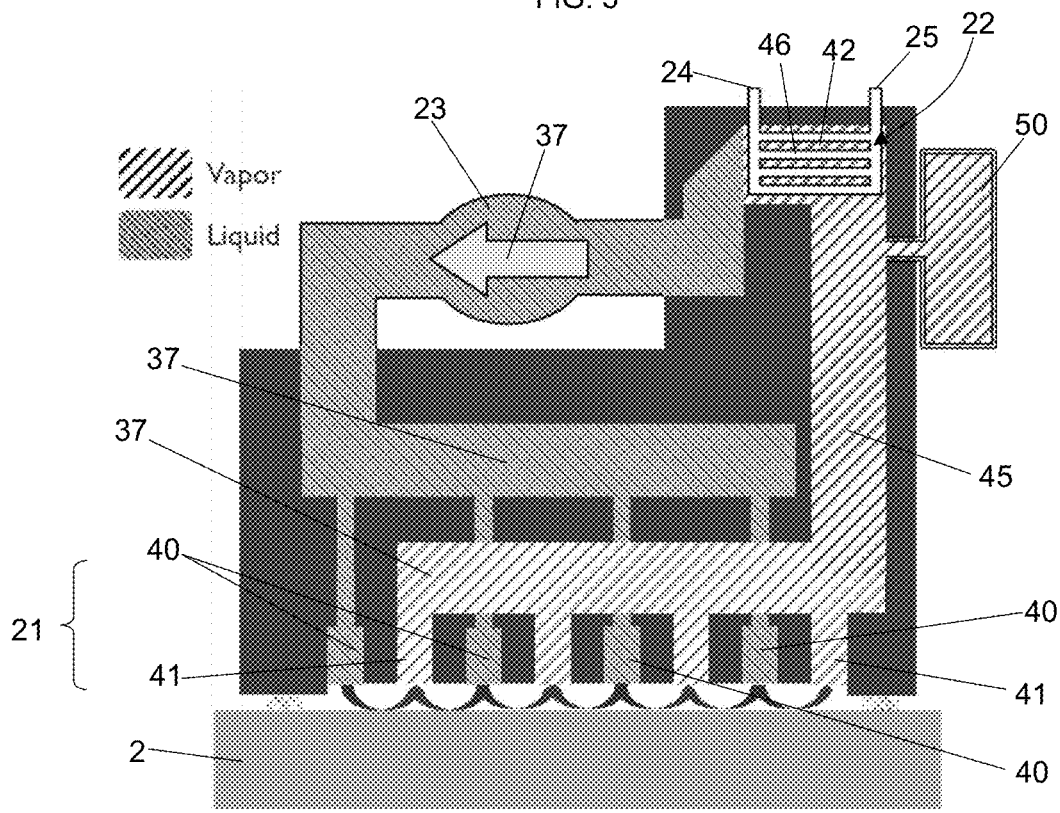
FIG. 6 is a schematic section view of the internal channels in a device according to another embodiment of the disclosed technology, configured to circulate a cooling fluid that changes from the liquid state to the gaseous state and vice versa while circulating in the device.

Such an embodiment is illustrated in FIG. 6. The idea here is to supply a cooling liquid to the impingement channels 40 at a temperature and pressure at which the cooling liquid at least partially evaporates through its contact with the surface of the chip package 2. A vapor or a mixture of liquid and vapor then flows through the internal channel 45. The drawing in FIG. 6 and its accompanying legend illustrates the case where all the cooling liquid is vaporized, but the device can also work when the cooling liquid is not completely vaporized, so that a mixture of vapor and liquid flows through the internal channel 45.

An expansion reservoir 50 may be added to the device. The reservoir 50 is in fluid communication with the internal channel 45, thereby enabling the expansion of the vapor formed by the evaporation of the cooling liquid. The refrigerant enters the heat exchanger 22 via the inlet opening 24 and leaves the heat exchanger 22 via the outlet opening 25, as in the previous embodiment. Also as in the previous embodiment, the cooling fluid (now fully or partially in the gaseous state) flows through a plurality of heat exchange channels 42 of the heat exchanger 22, while exchanging heat with the refrigerant flowing from the inlet 24 to the outlet 25 through one or more refrigerant channels 46. The temperature of the refrigerant is controlled in such a manner that the heat exchanger 22 now works as a condenser, that is, the cooling fluid turns back into the liquid state before being pumped back to the impingement channels 40 by the pump 23. The dimensions and design of the heat exchanger and the temperature of the refrigerant are such that essentially all the vapor is transformed to liquid at the outlet of the heat exchanger 22, that is, the pump 23 is displacing only liquid.

In the embodiment illustrated in FIG. 6, the heat exchanger 22 is placed at a higher level than the pump 23, when the device is placed on a substantially horizontal surface. This can facilitate the flow of liquid back to the pump 23, but it is not a strict requirement. Whether or not it is required or helpful may depend, for example, on the type of pump that is being used. A configuration as shown in FIG. 5, with the addition of an expansion reservoir, can also work as a cooling device using evaporation of the cooling fluid, provided that the pump is able to create sufficient suction for effectively displacing the condensed fluid.

As the heat exchange with the chip package 2 now takes place through evaporation of the cooling liquid, the cooling power can be considerably increased compared to embodiments using a cooling fluid that is in the liquid state throughout the cycle.

In order for the embodiment of FIG. 6 to function optimally, the cooling fluid can have suitable properties, so that it is certain to evaporate at the temperature of the component that is being cooled. Various cooling fluids are known, however, from cooling technologies in general, and the person skilled in the art will be able to select a suitable fluid on the basis of the required cooling power and on the basis of the operative temperature range of the refrigerant.

In any embodiment according to the disclosed technology, the cooling fluid and the refrigerant could be the same fluid. It is, however, also possible to use different fluids. In the embodiment of FIGS. 2 to 5, where the cooling fluid is in the liquid state throughout the primary flow cycle 6, the cooling fluid could be water. In the embodiment of FIG. 6, another type of cooling fluid is preferred, for example a commercially available fluorocarbon-based fluid having a boiling temperature lower than that of water.

The disclosed technology is related to a cooling device 20 according to any of the embodiments described above or equivalent to such embodiments, and to a cooling system including the device and further including the secondary refrigerant loop 10.

While the disclosed technology has been illustrated and described in detail in the drawings and foregoing description, such illustration and description are to be considered illustrative or exemplary and not restrictive. Other variations to the disclosed embodiments can be understood and effected by those skilled in the art in practicing the disclosed technology. In the claims, the word "comprising" does not exclude other elements or steps, and the indefinite article "a" or "an" does not exclude a plurality. The mere fact that certain measures are recited in mutually different dependent claims does not indicate that a combination of these measures cannot be used to advantage.

What is claimed is:

1. A device for cooling an electronic component, comprising:
   a plurality of impingement channels configured to enable a cooling fluid in the liquid state to impinge on a surface of the electronic component, when the device is mounted in close proximity to the surface;
   a plurality of return channels configured to conduct the cooling fluid away from the surface after exchanging heat with the surface;
   a pump configured to cyclically drive the flow of the cooling fluid in a flow cycle that is confined within the device, the flow cycle including the flow of the cooling fluid through the plurality of impingement channels and subsequently through the plurality of return channels;
   a heat exchanger comprising:
      one or more heat exchange channels configured so that the flow cycle further includes the flow of the cooling fluid through the one or more heat exchange channels before or after exchanging heat with the surface of the electronic component, and
      one or more refrigerant channels configured to allow the passage of a refrigerant so as to enable a heat exchange between the refrigerant and the cooling fluid; and
   a housing, wherein the plurality of impingement channels, the plurality of return channels, and the heat exchanger are integrated in the housing, the housing comprising a refrigerant inlet and a refrigerant outlet configured to enable the refrigerant to consecutively flow into the device, through the one or more refrigerant channels, and out of the device, wherein the housing is shaped as a rectangular block with the one or more heat exchange channels of the heat exchanger running vertically when the housing is mounted on a horizontal surface, and wherein the refrigerant inlet and the refrigerant outlet are located in opposite sidewalls of the housing, with the one or more refrigerant channels running transversally relative to the one or more heat exchange channels.

2. The device according to claim 1, wherein the housing further comprises an inlet opening and an outlet opening for the cooling fluid, and wherein the pump is mounted on the housing and coupled to the inlet opening and the outlet opening.

3. The device according to claim 1, wherein the housing is an integral piece formed of a single material.

4. The device according to claim 1, wherein the housing is an assembly of a first housing comprising the plurality of impingement channels and the plurality of return channels, and a second housing comprising the heat exchanger.

5. The device according to claim 1, wherein the pump is a micropump.

6. The device according to claim 1, wherein the plurality of impingement channels are arranged in a square or rectangular array, each impingement channel being at least partly surrounded by a return channel of the plurality of return channels.

7. The device according to claim 1, wherein the device is configured to circulate the cooling fluid in the liquid state of the cooling fluid.

8. The device according to claim 1, further comprising an expansion reservoir such that the device is configured to:
- cool the electronic component through the at least partial evaporation of the cooling fluid when the cooling fluid impinges on the electronic component in the liquid state;
- expand the cooling fluid in the gaseous state, in the expansion reservoir; and
- condense the cooling fluid from the gaseous state to the liquid state in the heat exchanger, the heat exchanger thereby acting as a condenser.

9. The device according to claim 8, wherein the expansion reservoir is in fluid communication with an internal channel formed in the housing, and wherein the internal channel is configured to conduct a vapor formed by the evaporation from the plurality of return channels to the heat exchanger.

10. The device according to claim 8, wherein the heat exchanger is placed at a higher level than the pump, when the device is placed on a horizontal surface.

11. A cooling system for cooling an electronic component, the system comprising the device according to claim 1, and a refrigerant loop for circulating the refrigerant therein, wherein the refrigerant loop includes the passage from the refrigerant inlet of the device to the refrigerant outlet of the device.

\* \* \* \* \*